US009024256B2

(12) United States Patent
Ruan et al.

(10) Patent No.: US 9,024,256 B2
(45) Date of Patent: May 5, 2015

(54) ELECTRON MICROSCOPE

(71) Applicant: Board of Trustees of Michigan State University, East Lansing, MI (US)

(72) Inventors: Chong-Yu Ruan, Okemos, MI (US); Martin Berz, DeWitt, MI (US); Zhensheng Tao, Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 14/453,235

(22) Filed: Aug. 6, 2014

(65) Prior Publication Data

US 2014/0346355 A1 Nov. 27, 2014

Related U.S. Application Data

(63) Continuation of application No. PCT/US2013/024860, filed on Feb. 6, 2013.

(60) Provisional application No. 61/595,725, filed on Feb. 7, 2012.

(51) Int. Cl.
| | |
|---|---|
| H01J 37/26 | (2006.01) |
| G01N 21/65 | (2006.01) |
| G01N 23/04 | (2006.01) |
| G01N 23/08 | (2006.01) |
| H01J 37/073 | (2006.01) |
| H01J 37/04 | (2006.01) |
| H01J 37/065 | (2006.01) |
| H01J 37/22 | (2006.01) |
| H01J 37/147 | (2006.01) |
| H01J 37/28 | (2006.01) |

(52) U.S. Cl.
CPC ............ *H01J 37/263* (2013.01); *H01J 37/073* (2013.01); *H01J 37/045* (2013.01); *H01J 37/065* (2013.01); *H01J 37/228* (2013.01); *H01J 37/26* (2013.01); *H01J 2237/0432* (2013.01); *H01J 2237/06333* (2013.01); *H01J 37/1471* (2013.01); *H01J 37/28* (2013.01); *H01J 2237/2802* (2013.01)

(58) Field of Classification Search
USPC ...................... 250/306, 307, 310, 311, 492.3; 313/231.31, 231.61; 315/111.81
See application file for complete search history.

(56) References Cited

U.S. PATENT DOCUMENTS

| | | | |
|---|---|---|---|
| 4,641,104 A | | 2/1987 | Blosser et al. |
| 5,510,624 A | * | 4/1996 | Zaluzec ................... 250/441.11 |
| 5,811,804 A | * | 9/1998 | Van Blitterswijk et al. .. 250/311 |
| 6,203,865 B1 | * | 3/2001 | Badzian et al. ............... 427/596 |

(Continued)

OTHER PUBLICATIONS

Anderson, S.G., et al; "Velocity bunching of high-brightness electron beams," Physical Review Special Topics—Accelerators and Beams, vol. 8, Jan. 18, 2005, pp. 014401-1-014401-22.

(Continued)

*Primary Examiner* — Bernard E Souw
(74) *Attorney, Agent, or Firm* — Harness, Dickey & Pierce, P.L.C.

(57) ABSTRACT

An electron microscope is provided. In another aspect, an electron microscope employs a radio frequency which acts upon electrons used to assist in imaging a specimen. Furthermore, another aspect provides an electron beam microscope with a time resolution of less than 1 picosecond with more than $10^5$ electrons in a single shot or image group. Yet another aspect employs a super-cooled component in an electron microscope.

45 Claims, 6 Drawing Sheets

(56) References Cited

U.S. PATENT DOCUMENTS

| | | | |
|---|---|---|---|
| 6,452,315 B1* | 9/2002 | Vane | 313/231.31 |
| 6,875,983 B2 | 4/2005 | Nakazawa et al. | |
| 7,154,091 B2* | 12/2006 | Zewail et al. | 250/311 |
| 7,507,960 B2 | 3/2009 | Zani et al. | |
| 7,696,847 B2 | 4/2010 | Antaya | |
| 7,994,472 B2* | 8/2011 | Plettner et al. | 250/251 |
| 2006/0061285 A1* | 3/2006 | Lewellen et al. | 315/5.35 |
| 2007/0075263 A1* | 4/2007 | Gorrell et al. | 250/400 |
| 2011/0017247 A1 | 1/2011 | Vane et al. | |
| 2013/0336348 A1* | 12/2013 | Xiong et al. | 372/36 |

OTHER PUBLICATIONS

Dömer, H., et al.; "High-speed transmission electron microscope," Review of Scientific Instruments, vol. 74, No. 10, Oct. 2003, pp. 4369-4372.

"Electron Microscope," Wikipedia, http://en.wikipedia.org/wiki/Electron_microscopy, 13 pp., printed Jan. 5, 2012.

Fill, Ernst, et al.; "Sub-fs electron pulses for ultrafast electron diffraction," New Journal of Physics, vol. 8, 272, Nov. 13, 2006, 11 pages.

Hastings, J.B., et al.; "Ultrafast time-resolved electron diffraction with megavolt electron beams." Applied Physics Letters, vol. 89, Nov. 3, 2006, pp. 184109-1-184109-3.

Kiewiet, F.B., et al.; "Femtosecond synchronization of a 3 GHz RF oscillator to a mode-locked Ti:sapphire laser," Nuclear Instruments and Methods in Physics Research A, vol. 484, 2002, pp. 619-624.

King, Wayne E., et al.; "Ultrafast electron microscopy in materials science, biology, and chemistry," Journal of Applied Physics, vol. 97, Jun. 8, 2005, pp. 111101-1-111101-27.

LaGrange, T., et al.; "Single-shot dynamic transmission electron microscopy." Applied Physics Letters, vol. 89, Jul. 25, 2006, pp. 044105-1-044105-3.

Lobastov, Vladimir A., et al.; "Four-dimensional ultrafast electron microscopy," PNAS, vol. 102, No. 20, May 17, 2005, pp. 7069-7073.

Musumeci, P., et al.; "High quality single shot diffraction patterns using ultrashort megaelectron volt electron beams from a radio frequency photoinjector," Review of Scientific Instruments, vol. 81, 2010, pp. 013306-1-013306-3.

Park, Hyun Soon, et al.; "Atomic-Scale Imaging in Real and Energy Space Developed in Ultrafast Electron Microscopy," Nano Letters, vol. 7, No. 9, Sep. 2007, pp. 2545-2551.

"Scanning electron microscope," Wikipedia, http://en.wikipedia.org/wiki/Scanning_electron_microscope, printed Jan. 11, 2012, 18 pages.

Schroeder, W. Andreas; "Prospects for Ultrafast Electron Microscopy: Electron Pulse Compression and Spatial Coherence," Microsc Microanal, 11 (Suppl 2), 2005, pp. 42-43.

"Transmission electron microscopy," Wikipedia, http://en.wikipedia.org/wiki/Transmission_electron_microscope, printed Jan. 5, 2012, 28 pages.

"Type-II superconductor," Wikipedia, http://en.wikipedia.org/wiki/Type-II_superconductor, printed Jan. 30, 2012, three pages.

Uesaka, Mitsuru; "Femtosecond Beam Sources and Applications," Advanced Accelerator Concepts Workshop 2004, Jun. 25, 2004, 51 pages.

"Ultrafast Electron Microscopy," UIC Ultrafast Physics Group, http://ultrafast.phy.uic.edu/research/ultrafast-electron-microscopy, printed Jan. 5, 2012, three pages.

Van Oudheusden, T., et al.; "Electron source concept for single-shot sub-100 fs electron diffraction in the 100 keV range," Journal of Applied Physics, vol. 102, Nov. 1, 2007, pp. 093501-1-093501-8.

Veisz, L., et al.; "Hybrid dc-ac electron gun for fs-electron pulse generation," New Journal of Physics, vol. 9, 451, Dec. 20, 2007, 17 pages.

Watanabe, M., et al.; "RF Beam for the HiECR Ion Source," Annual Report 2003, Center for Nuclear Study, Graduate School of Science, the University of Tokyo, Aug. 2004, p. 72.

Yang, Jinfeng, et al.; " 100-femtosecond MeV electron source for ultrafast electron diffraction," Radiation Physics and Chemistry, vol. 78, 2009, pp. 1106-1111.

* cited by examiner

ELECTRON MICROSCOPE

GOVERNMENT SUPPORT CLAUSE

This invention was made with government support under NSF-DMR 1126343 awarded by the National Science Foundation. The government has certain rights in the invention.

CROSS-REFERENCE TO RELATED APPLICATIONS

This application is a Continuation of International Patent Application No. PCT/US2013/024860, filed Feb. 6, 2013, which claims priority to U.S. Provisional Patent Application No. 61/595,725, filed Feb. 7, 2012, which are both incorporated by reference herein.

BACKGROUND AND SUMMARY

The present disclosure relates generally to electron microscopes and more particularly to an electron microscope using radio frequencies and/or super-cooling.

It is known to employ transmission electron microscopes and scanning electron microscopes to obtain a magnified image of a specimen. Exemplary conventional electron microscopes are disclosed in U.S. Pat. No. 5,811,804 entitled "Electron microscope with Raman Spectroscopy" which issued to Van Blitterswijk et al. on Sep. 22, 1998. This patent is incorporated by reference herein. Another approach is disclosed in U.S. Pat. No. 7,154,091 entitled "Method and System for Ultrafast Photoelectron Microscope" which issued to Zewail et al. on Dec. 26, 2006, and is incorporated by reference herein. Such a device, however, employs a high repetition rate and only emits approximately one electron per each 10 nanosecond shot; even if the specimen event only lasts for 10 nanoseconds then a poor quality image will likely be created if the event is not precisely reproducible.

In many traditional electron microscopes for time-resolved studies, the imaging is carried out in pulse mode, which must compress electrons in a continuous transmission electron microscopic stream into short packets. In a sub-nanosecond arrangement, the density of electrons in packets reaches some 7-9 orders of magnitude higher than that in a steady stream. Such an implementation proves to be detrimental for traditional electron optics used in electron microscopes. Moreover, because of the strong coulombic dispersive forces and statistical fluctuations associated with the high-density electron packets, the coherence, spatial focusing, and ultimately the time resolution needed for freeze-frame imaging of atoms, are destroyed. This well-known space-charge problem has so far hindered any significant progress in using a high-density beam in a conventional microscope to form an atomically sharp image in a sub-nanosecond time scale.

Furthermore, experiments have been made with a dynamic transmission electron microscope. Such a device is disclosed in LaGrange, T. et al., "Single-Shot Dynamic Transmission Electron Microscopy," *Appl. Phys. Lett.* 89, 044105 (2006). While this device provides a large quantity of electrons, it does so in a very slow 1 nanosecond pulse. Therefore, it is not fast enough to provide a clear freeze-framing image before the sample or reaction changes. Generally, to produce a clear image in time-resolved microscope, its time resolution must be better than the atomic reaction time scale, typically on 1 picosecond or less timescale.

In accordance with the present invention, an electron microscope is provided. In another aspect, an electron microscope employs a radio frequency which acts upon electrons used to assist in imaging a specimen. Furthermore, another aspect provides an electron beam microscope with a time resolution of less than 1 picosecond with more than $10^5$ electrons in a single shot or image group. Yet another aspect employs a super-cooled component in an electron microscope. Moreover, a further aspect of an electron microscope uses a radio frequency wave to assist in bunching or increasing the density of a series of electrons. A method of operating an electron microscope is also set forth.

The electron microscope of the present invention is advantageous over traditional devices. For example, space-charge effects in a short-pulse electron beam are overcome by use of a radio frequency electron pulse compressor or cavity in an electron microscope beam column with a high-field photo gun, in one aspect. This serves to advantageously achieve much higher intensity images and time resolution than conventional time-resolved microscopes. Furthermore in an aspect, the present electron microscope is advantageously more flexible in terms of pulsed mode imaging, such that a probe size can be easily tuned from nanometer to micrometer, and it can be easily switched from a diffraction mode to a microscopy mode. Additionally, the present electron microscope allows for retrofitting radio frequency cavities onto previously assembled electron microscopes thereby significantly enhancing time-resolution but at less than half the cost of an entirely new microscope. Additional advantages and features can be found in the following description and appended figures.

DETAILED DESCRIPTION

The preferred embodiment of an electron microscope 11 of the present invention is shown in FIGS. 1-4. Electron microscope 11 is more specifically an ultrafast, electron diffraction microscope that will overcome the conventional space-charge limitation by including a radio frequency ("RF") gun assembly 13, an ultrafast laser 15, a bunching radio frequency cavity 17 and electron beam optics for optimal high-brightness electron microscope operation. By implementing high-field RF gun assembly 13 and an RF buncher 17, significantly higher beam intensity can be achieved. The space-charge broadened electron pulse is recompressed spatially as well as temporally to reach simultaneous femtosecond-nanometer resolution even at the high-space and temporal focusing condition as required in a time-resolved electron microscope.

Electron microscope 11 further includes an electron beam column 19, a compensating lens 21, a condenser lens 23, scan coils 25, an objective lens 27, and a beam diagnostic system 29. Furthermore, a sample chamber 31, and an imager such as a CCD camera 33, are provided. Electron beam column 19 longitudinally extends between RF gun assembly 13 and bunching RF cavity 17. Vacuum pipes 35 and binoculars 36 are also provided.

More particularly, RF gun assembly 13 includes an electron beam gun 41 having a cathode, as well as a two-part housing 43 within which is a generally annular upper RF cavity 45. Upper RF cavity 45 has a generally ∞ (i.e., sideways figure-8) cross-sectional shape or including additional cell and magnetic lens for better control of the initial phase space (so-called emittance) with electron beam gun 41 located in the middle intersection of cross-sectional circles, to emit an electron beam 47 consisting of a pulse group or series of electrons 49 (see FIG. 6) along the longitudinal length of electron beam column 19. A radio frequency loop inwardly extends into a side port of upper RF cavity 45 for energy coupling between a coax line and the cavity; this generates radio frequency waves between 500 MHz and 3 GHz, between 100 W and 5 kW, depending on the electron beam energy and ultimate resolution desired and the quality of the cavity. As will be discussed in greater detail hereinafter, probe laser beam pulses 51 are emitted by laser 15 and received within upper RF cavity 45 so as to cause generation of a high electric field that extracts each electron from the cathode at an end of the cavity, which is advantageously an order of magnitude greater than a conventional DC electron gun. In the present RF gun design, the gradient field near the photo-cathode can be as high as 200 Mega Volts per meter (MV/m), whereas conventional DC guns are limited to less than 10 MV/m.

A cryojacket 61, cooled by a helium close cycle refrigerator 63, surrounds housing 43 of upper RF cavity 45. Housing 43 is machined from a niobium metal alloy, such as niobium-titanium or niobium-tin, so that it is super-conducting. Thus, RF cavity 45 is super-cooled to an inner surface temperature equal to or less than 10 Kelvin, and more preferably less than 9 Kelvin. The super-cooling increases the allowed extraction field of RF gun assembly 13. A low temperature cathode is used which further increases the performance to at least $10^5$, and more preferably $10^6$, electrons per pulse, which far exceeds the single-shot limit of conventional microscopes.

Figure 1:
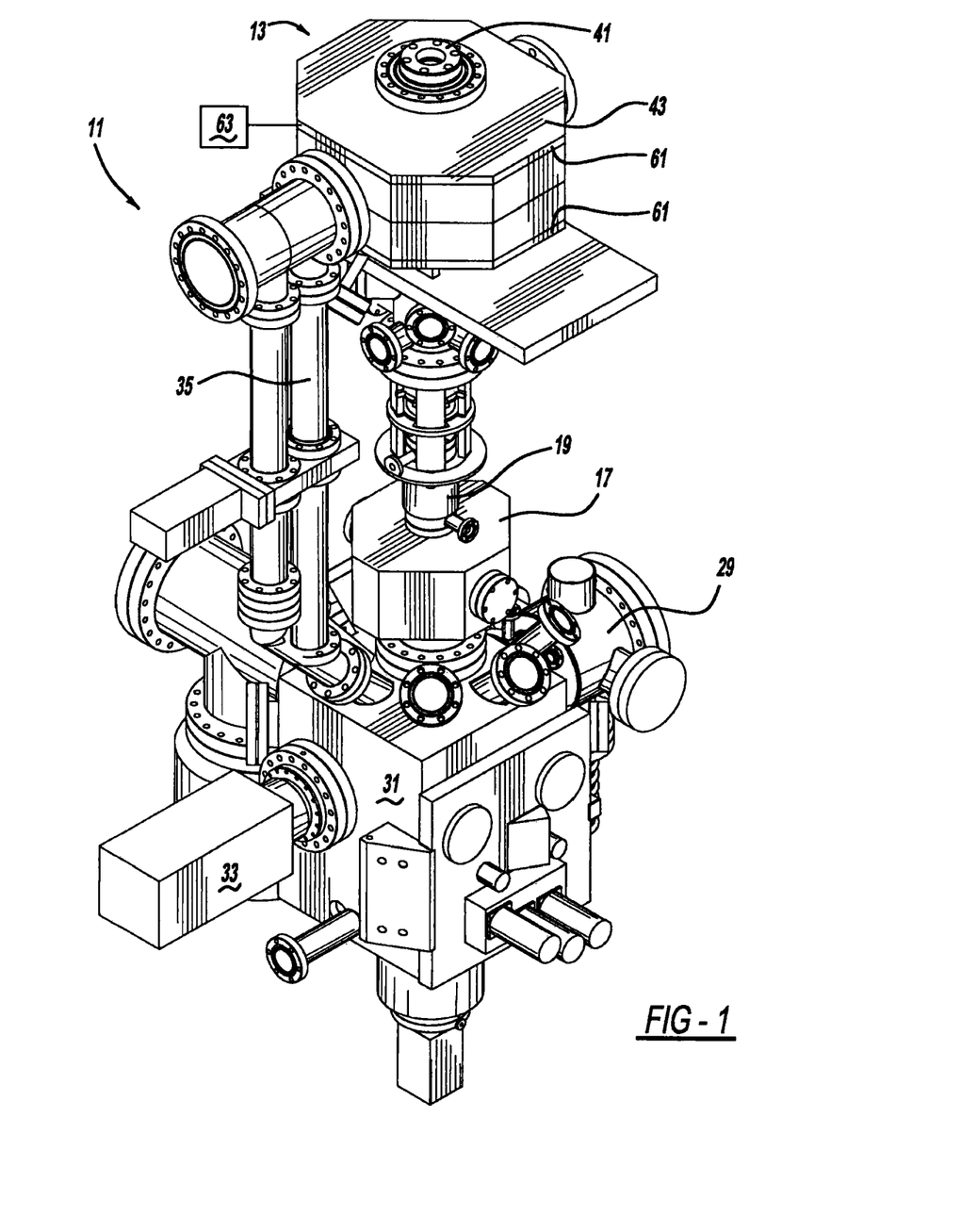
FIG. 1 is a perspective view showing an electron microscope of the present invention.
Figure 2:
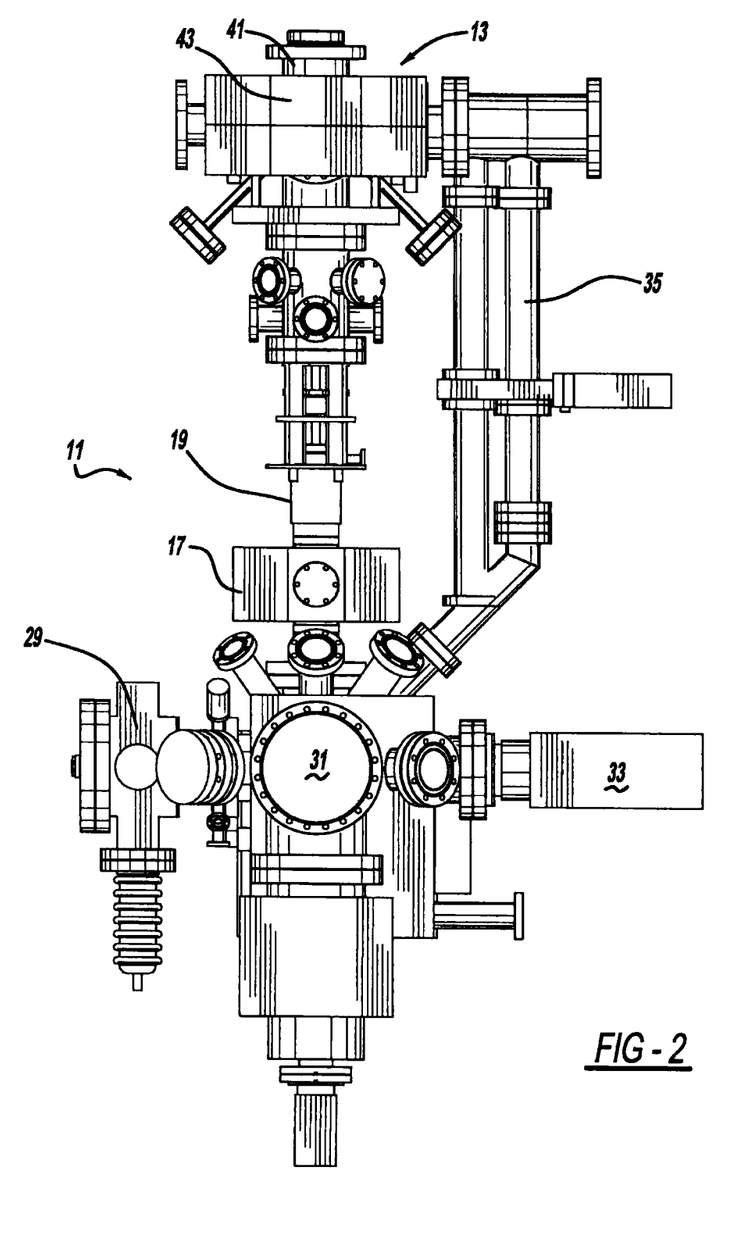
FIG. 2 is a side elevational view showing the electron microscope.
Figure 3:
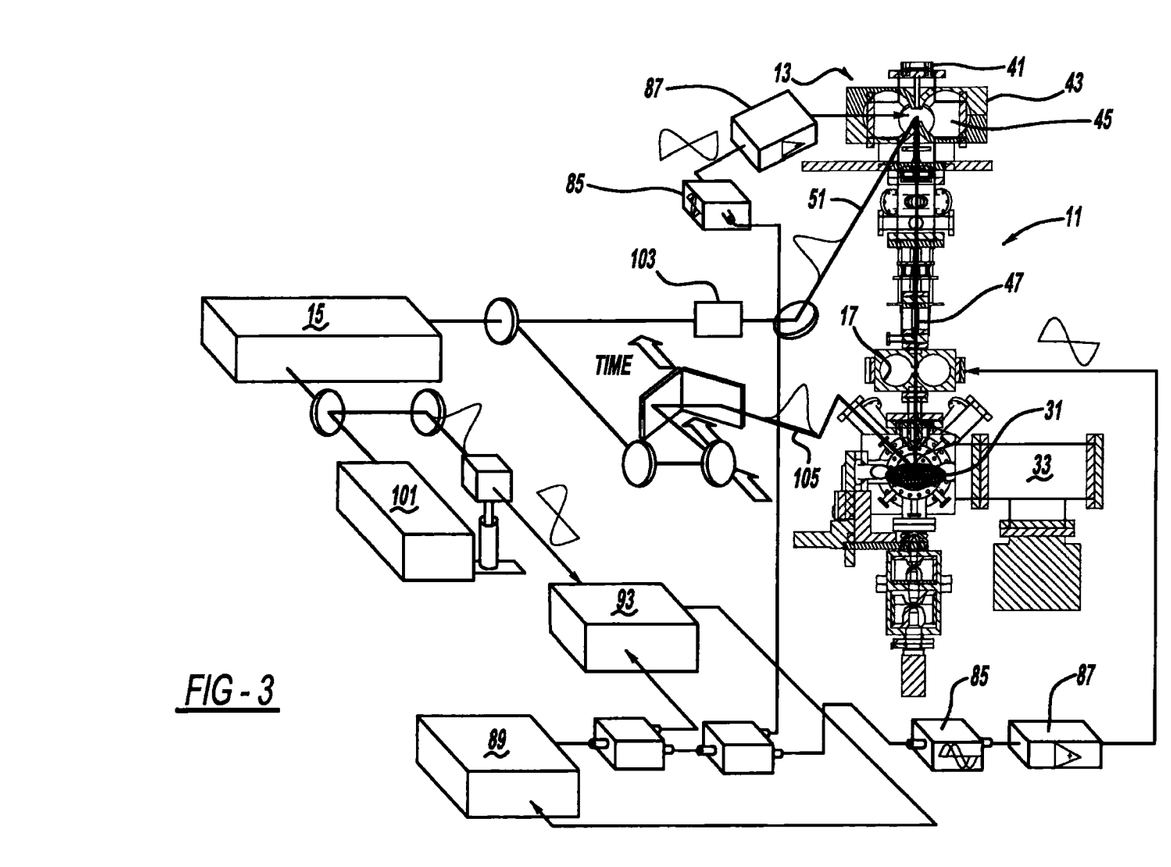
FIG. 3 is a longitudinal sectional view in combination with a diagrammatic view of the electron microscope.
Figure 4:
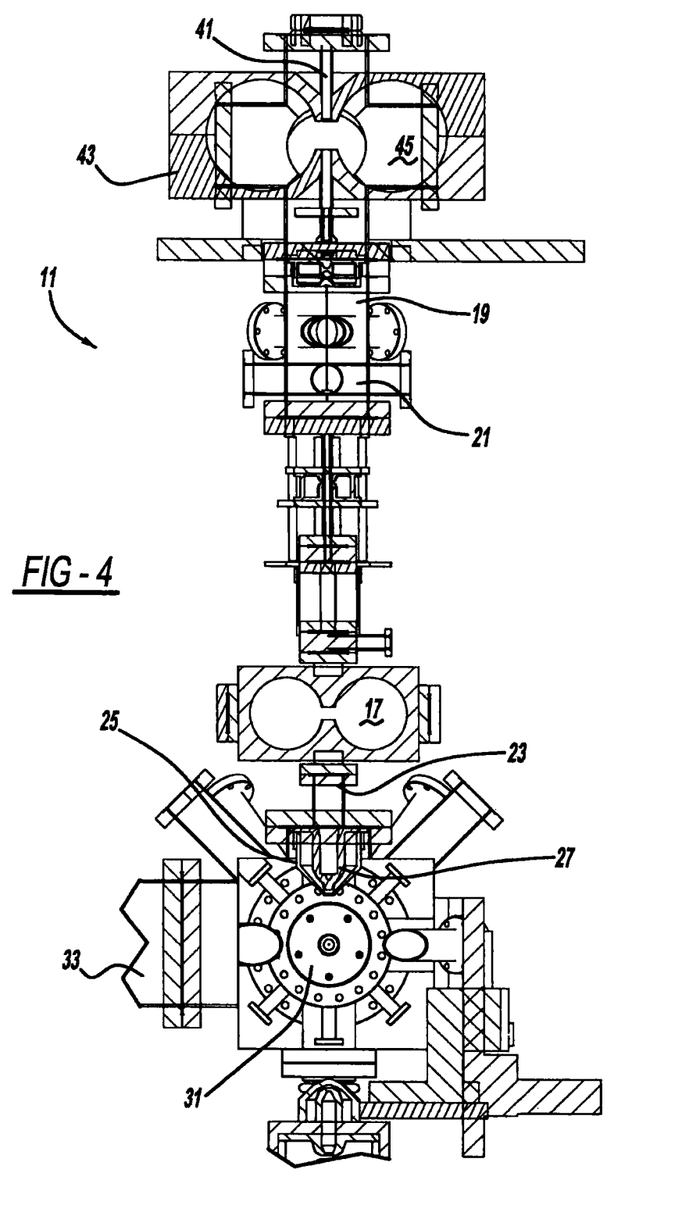
FIG. 4 is an enlarged longitudinal sectional view of the electron microscope.
Figure 5:
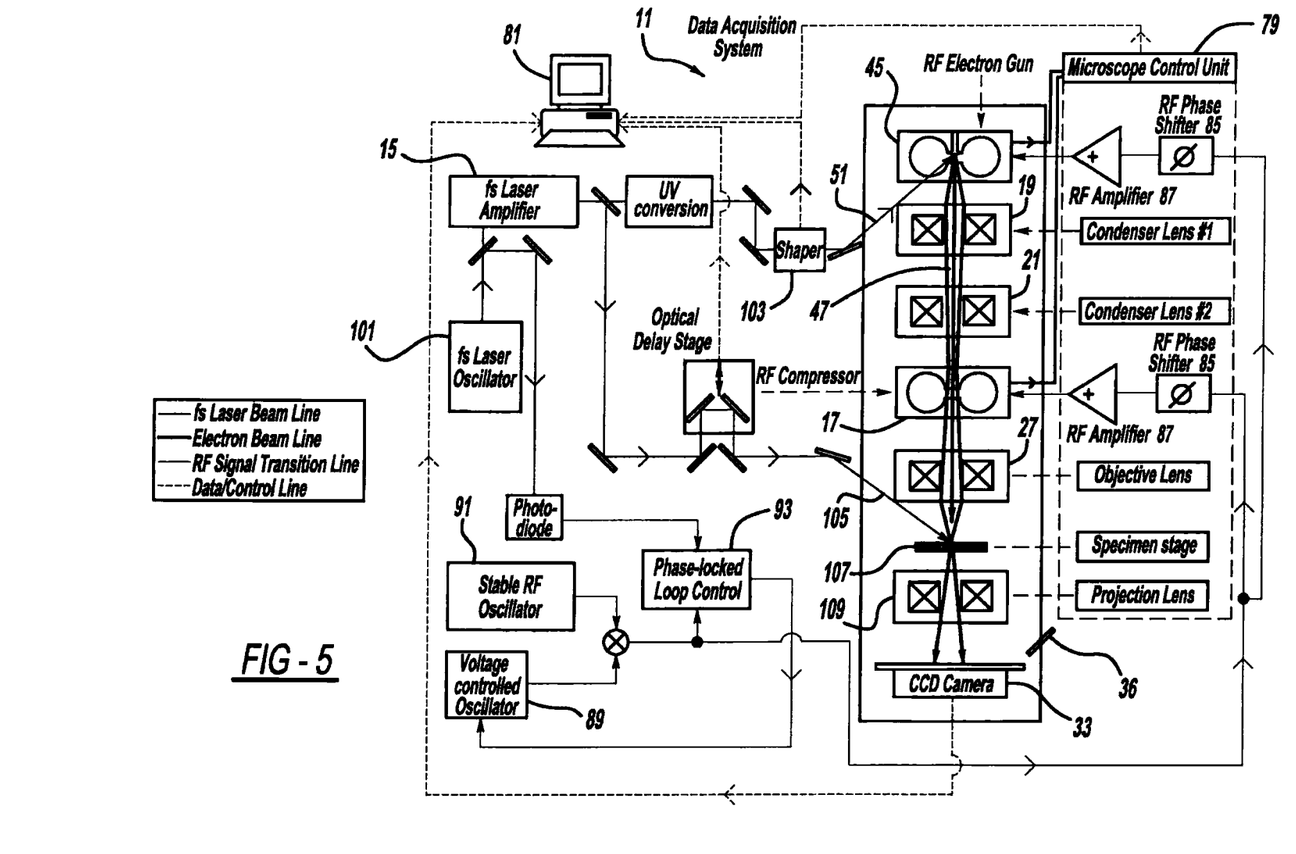
FIG. 5 is a diagrammatic view of the electron microscope.

Referring now to FIGS. 3 and 5, a microscope control unit 79 communicates with a programmable computer controller 81 of a data acquisition system 83. Microscope control unit 79 includes a pair of RF phase shifters 85 and a pair of RF amplifiers 87 connecting RF cavities 45 and 17 with a voltage controlled oscillator 89, a stable RF oscillator 91 and a phase-locked loop control 93. The operational regime of upper RF cavity 45 is in the ~1 GHz regime and the field necessary for optimal bunch compression is 1-5 MV/m. Correspondingly, the power consumption is estimated in the range of <3 kW if the cavity is constructed using oxygen-free, high thermal conductivity metal. Using a re-entrant cavity, which has a high efficiency, reduces the power consumption to merely 700 W. Such an RF power load can be easily achieved with all solid-state RF amplifier technology, which is compatible with a coaxial power cable to deliver the RF power to the cavities, and which greatly eases the construction and operation of the RF system. It is desirable that the phase relationship between the electron bunches and the RF field be precisely controlled; generally, the tuning between the laser pulse and RF field should be precise to within the bunch width. To achieve such accuracy, the arrival time jitter is maintained to the level of $10^{-6}$ for the power supply of electron beam gun 41. To achieve a high accuracy in synchronizing femtosecond electron and laser pulses 51, high harmonics signals extracted from the output of a femtosecond laser oscillator 101 are synchronized to RF amplifier 87 via voltage controlled oscillator 89 in a phase-locked loop ("PLL") design. The relatively low RF power required in the present design allows continuous wave (CW) operation of the RF cavity, as compared to a pulsed mode used in most RF cavities in large accelerators. The CW operation helps reduce the jitter and ultimately makes the synchronization in the 10 femtosecond range possible.

Controlling dynamics of laser beam pulse 51 using femtosecond pulse-shaping techniques is employed. For example, a programmable pulse shaper 103 is used to automatically characterize and compensate for undesired distortions in the pulse using multiphoton intrapulse interference phase scan software; such a device can be obtained from Biophotonics Solutions Inc. of East Lansing, Mich. This is ideally suited for ultrafast pulses 51 each having a controllable pulse shape designed to optimize the photoemission of electrons from the photo-cathode. The duration, rise and decay times of the laser pulses can be varied for conditions optimized either for high density or low emitance operation, and can range from tens to hundreds of femtoseconds. A split laser beam pulse 105, acts as a pump pulse, to drive or energize the target specimen to be imaged on a sample holder 107 located within specimen chamber 31. Sample holder 107 is located between the upper objective lens 27 and a lower objective (or projection) lens 109 for transmission electron microscope ("TEM") 11, and just below objective lens 27 in a scanning electron microscope ("SEM"). The lenses are of an electro-magnetic construction.

The initial emittance associated with the photoemission and the ensuing space-charge-induced growth of emittance will ultimately define the optimal achievable space-time focusing following RF recompression. For example, creating favorable conditions for photoemission to produce an early stage ellipsoidal bunch with a roughly linear internal space-charge force would promote self-similar electron bunch dynamics, zero emittance growth, and conditions for optimal recompressibility by a linear buncher system. The laser pulse shaping capability, coupled with the direct electron bunch imaging technique controls electron pulse generation and dynamics, facilitates the generation of ellipsoidal bunches for attaining the highest achievable space-time focusing.

Figure 6:
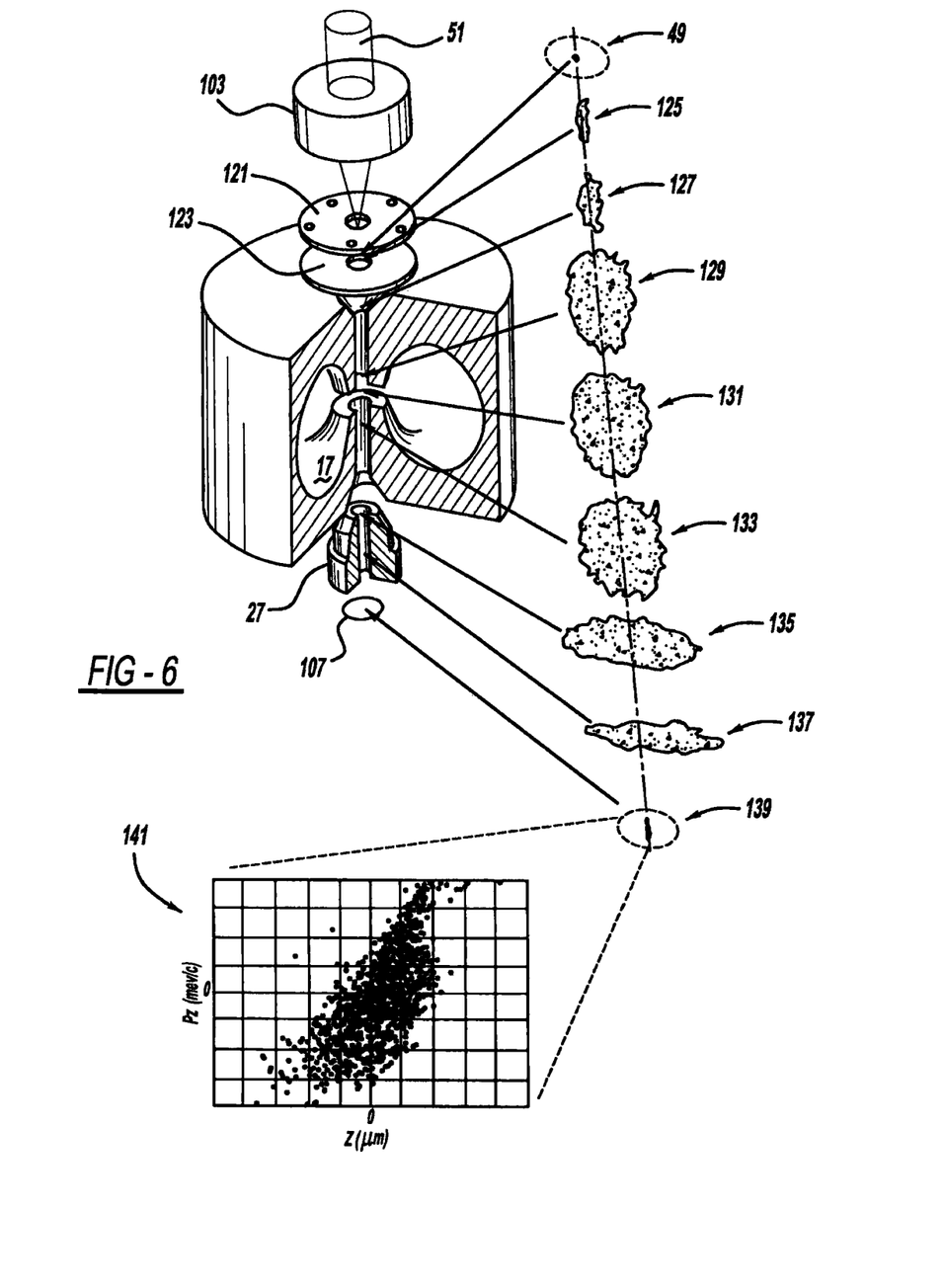
FIG. 6 is a fragmentary perspective view showing a portion of the electron microscope.

FIGS. 5 and 6 illustrate laser beam pulse 51 being shaped by pulse shaper 103 and then being received by a photo-cathode 121 and anode 123 in electron beam gun assembly 13. This causes a series of at least $10^5$, and more preferably $10^6$ or greater, quantity of electrons to be emitted from the downstream end of upper RF cavity 45 in a single pulse. The series of electrons 49 has a longitudinally elongated pattern at this location 125 and also at location 127, after passing through condenser lenses 19 and 21. Thereafter, when the electrons initially enter lower bunching RF cavity 17 at location 129, the series or pulse of at least $10^5$ electrons will have a greater lateral width but still approximately the same longitudinal length. Subsequently, the radio frequency waves in bunching RF cavity 17 serve to longitudinally bunch and compress the series of electrons in part, by slowing down the leading electrons; this is shown in locations 131 and 133. With the assistance of upper objective lens 27, the pulse group of electrons is somewhat laterally compressed and densified to concentrate the beam; nevertheless, the electrons in the beam are laterally widened at least twice its longitudinal length, as shown at locations 135 and 137. This pulse group of at least $10^5$ electrons has a time resolution of less than 1 picosecond when at the specimen location 139 to create a high-resolution image 141. The electron bunch dynamics corresponds to spatiotemporal evolution of the electron bunch in the respective locations in the column undergoing space-charge expansion, RF compression, and magnetic focusing while traversing electron beam column 19.

Bunching RF cavity 17 reverses space-charge pulse lengthening, and the RF field therein is coupled to appropriately matched focusing lens 27. The overall flight distance in this arrangement is less than 1 meter. With such a setup, the space-charge effect is reversed and the electron bunch is recompressed to the less than 1 picosecond timescale. Increasing the acceleration voltage is expected to further reduce the virtual cathode effect induced by space-charge, yielding improved electron density.

In other words, the RF-enabled, high-brightness femtosecond electron microscope 11 uses an efficient RF photon gun coupled with RF cavities and a serial condenser/objective strong lens system to demagnify the beam down to sub-pm scale, while maintaining the femtosecond pulse characteristic. Incorporation of the strong lens will also cause additional adjustment of the beam phase space as part of the space charge effects considered in the microscope design. The accumulated space-charge effects are effectively compensated by employing the RF gun assembly and RF buncher. Furthermore, tunability exists in the arrangement of the microscope electron lens; for example, the focal length can be adjusted and matched to different beam energies, and similar variability of the RF cavity with easily tunable field strength allows the modules to be compatible for a wide range of optimized conditions with energies up to 200 keV. The general architecture of this modular femtosecond electron microscope column 19 can be made by retrofitting the existing components in the microscope separately, allowing them to be assembled with great flexibility. Thus, the upper and bunching RF cavities and electronics can be optionally retrofit onto prior electron microscopes which will significantly improve their performance without the large expense of replacing the entire microscope.

Variable electron bunch generation is accomplished through a highly adjustable high-field RF gun assembly with a combination of pulse shaping and beam expansion optics to achieve spatiotemporal shaping of photoemission. The focusing lens is used to focus the beam to an appropriate transverse size to explore the regimes where the pre-buncher space-charge-led emittance growth is minimum. The beam characteristics will be in situ characterized by the ultrafast bunch imager, which characterizes less than 1 picosecond duration electron beams. The RF cavity works to recompress the longitudinal profile of the beam without leading to a blowup of the transverse emittance. With a combination of the condenser lens and the objective lens (with focal distance in the range less than 100 mm), it can switch from a focused small probe to parallel illumination for scanning/coherent diffraction. The sample is illuminated by the pump laser. To produce a nano-area coherent beam, an aperture is introduced before the condenser lens while the objective lens system is operated in parallel illumination mode. The position of the aperture is carefully considered at the location of the small beam density, so as to not generate significant wakefield effects as the pulsed electron beam crosses it. The temporal resolution can be made by incorporating the RF buncher to compensate the space-charge-led pulse lengthening, yielding a much improved temporal resolution. Nonetheless, in order to maintain the coherence of the beam, a large portion of the beam is thinned out by a coherence control aperture, reducing the pulse intensity to less than the single-shot limit. With the incorporation of the high-field and/or low-temperature RF gun assembly, the initial beam emittance is significantly reduced, thus leading to a significantly higher beam intensity reaching the single-shot limit, even after the coherence control aperture.

Applying the RF photogun, a field strength as high as 200 MV/m can be achieved. The combination of high acceleration field and low temperature enabled by the RF gun assembly significantly reduces the emittance of the photoelectrons and thereby increase the brightness of the beam. High field strength and low-temperature are helpful to reach the single-shot limit, i.e. with more than $10^6$ electron per electron bunch, for diffraction and imaging on the nanometer scale. With the photoemission processes under-control and well conditioned, recompression of the space-charge expansion in the longitudinal direction by the RF buncher will determine the ultimate temporal resolution achievable. The capability to reverse the longitudinal growth without significantly sacrificing the spatial coherence determines the ultimate space-time resolution limit of the femtosecond high-brightness electron microscope. Furthermore, a user can tune from diffraction mode to imaging mode by using projection lens system 109 to place either the diffraction plane or imaging plane onto the CCD screen.

While the preferred embodiment has been described hereinabove, it should be appreciated that variations can be made which fall within the scope of the present invention. For example, different imagers can be employed, such as use of fluorescent screens and the like. Furthermore, different, additional or fewer lenses and circuitry components for the electron beam, and different, additional or fewer optic components can be used to guide and control the laser beam pulses, although certain advantages may not be achieved. Alternate super-cooling systems can be employed such as those disclosed in U.S. Pat. Nos.: 7,696,847 entitled "High-Field Synchrocyclotron" which issued to Antaya on Apr. 13, 2010; and 4,641,104 entitled "Superconducting Medical Cyclotron" which issued to Blosser et al. on Feb. 3, 1987; both of which are incorporated by reference herein. Moreover, a laser actuated RF gun assembly can be used without super-cooling, and/or with a laser triggered DC gun, although these will degrade the electron beam characteristics and resultant image quality. It should also be appreciated that any of the features and devices described and shown for certain embodiments herein can be substituted, interchanged or added to any of the other embodiments, although many advantages may not be fully realized. It is intended that these and other variations fall within the scope of the present invention.

What is claimed is:

1. An electron microscope comprising:
    an electron gun operably emitting electrons;
    a radio frequency cavity within which a radio frequency is operably emitted to act upon the electrons;
    a pulse shaper adapted to shape a laser pulse received within the radio frequency cavity; and
    an imager operably using the electrons to at least one of: (a) create a magnified specimen image, or (b) produce diffraction patterns, after the electrons pass through the radio frequency cavity.

2. The electron microscope of claim 1, wherein the radio frequency cavity is adjacent the electron gun so as to act together in emitting the electrons, further comprising a bunching radio frequency cavity spaced away from and downstream of the electron gun.

3. The electron microscope of claim 2, further comprising a laser emitting a laser beam at the electron gun to assist in the emission of the electrons therefrom, and another laser beam also being emitted into a specimen chamber located downstream of the bunching radio frequency cavity.

4. The electron microscope of claim 1, further comprising an objective lens acting with the radio frequency cavity to control a density and focal distance of the electrons.

5. The electron microscope of claim 4, wherein the objective lens is an electromagnetic lens and the radio frequency cavity longitudinally compresses and widens at least a $10^5$ quantity of the electrons per pulse.

6. The electron microscope of claim 1, further comprising shaping the laser pulse with the pulse shaper which is controlled by a computer.

7. The electron microscope of claim 6, further comprising a cooling member super-cooling the radio frequency cavity to 10 Kelvin or less, and the radio frequency cavity being a machinable and super-conducting material.

8. The electron microscope of claim 1, wherein a quantity of the electrons is more than $10^5$ with a time resolution less than 1 picosecond, per pulse.

9. The electron microscope of claim 1, wherein the electron beam scans a specimen in a raster scan pattern, and the secondarily scattered electrons or beam-induced photons are collected to form an image.

10. The electron microscope of claim 1, wherein the image is created by transmission electron microscopy such that the electrons pass through a specimen and project onto the imager which is at least one of: (a) a fluorescent screen, or (b) a CCD camera.

11. The electron microscope of claim 1, wherein the radio frequency cavity is retrofit onto a previously assembled microscope electron beam column.

12. The electron microscope of claim 1, further comprising a microscope control circuit which comprises an amplifier and a phase shifter connected to the radio frequency cavity, and signals from a laser oscillator being synchronized to the amplifier in a phase-locked loop.

13. The electron microscope of claim 1, further comprising an electron beam column located between the radio frequency cavity and the electron gun, the radio frequency cavity bunching the electrons prior to imaging.

14. The electron microscope of claim 1, wherein the electron gun includes a DC gun.

15. An electron microscope comprising:
a radio frequency, femtosecond electron gun assembly operably emitting electrons within a radio frequency wave;
a bunching cavity located downstream of the electron gun assembly and having a radio frequency wave in the bunching cavity for assisting in creating a group of at least a $10^5$ quantity of the electrons with a time resolution of less than 1 picosecond, with a pattern of the electrons being wider than longer when they leave the bunching cavity; and
a lens assisting in focusing the electrons.

16. The electron microscope of claim 15, wherein the electron gun assembly further comprises a super-conducting radio frequency cavity which is super-cooled to less than or equal to 10 Kelvin.

17. The electron microscope of claim 15, further comprising radio frequency waves of 400 MHz-3 GHz and 100 W-5 kW increase the width-to-length ratio of the at least $10^5$ group of electrons between the electron gun and an imager, and the lens being an objective lens that laterally compresses the width of the group of electrons.

18. The electron microscope of claim 15, wherein a specimen image is created by scanning electron microscopy.

19. The electron microscope of claim 15, wherein a specimen image is created by transmission electron microscopy.

20. The electron microscope of claim 15, wherein the radio frequency cavity is retrofit onto a previously assembled microscope electron beam column.

21. An electron microscope comprising:
an electron gun operably emitting a series of electrons;
a housing surrounding at least a portion of the electron gun, the housing being made from a super-conducting material;
a super-cooler attached to the housing to operably cause an internal surface of the housing to have a temperature less than or equal to 10 Kelvin; and
an imager operably using the electrons to create a specimen image.

22. The electron microscope of claim 21, further comprising a radio frequency wave emitted inside the housing.

23. The electron microscope of claim 22, further comprising a shaped laser beam pulse received within the housing, and the super-conducting material comprises niobium.

24. The electron microscope of claim 22, further comprising:
a bunching radio frequency cavity spaced away from the housing;
at least one condenser lens located between the bunching radio frequency cavity and the electron gun; and
an adjustable objective lens located between the bunching radio frequency cavity and the imager.

25. The electron microscope of claim 21, wherein the super-cooler includes a cryo jacket which causes the internal surface of the housing to have a temperature less than 10 Kelvin.

26. The electron microscope of claim 21, wherein a quantity of the electrons is more than $10^5$ with a time resolution less than 1 picosecond, per image.

27. The electron microscope of claim 21, wherein the electron beam scans a specimen in a raster scan pattern, and the secondarily scattered electrons or beam-induced photons are collected to form an image.

28. The electron microscope of claim 21, wherein the image is created by transmission electron microscopy such that the electrons pass through a specimen and project onto the imager which is at least one of: (a) a fluorescent screen, or (b) a CCD camera.

29. An electron microscope comprising an electron gun and an imager, wherein a time resolution for at least $10^5$ electrons emitted by the electron gun is less than 1 picosecond per image created by the imager.

30. The electron microscope of claim 29, further comprising radio frequency waves being emitted adjacent the electron gun.

31. The electron microscope of claim 30, further comprising a shaped laser beam pulse acting with the electron gun to emit the electrons in a beam toward the imager.

32. The electron microscope of claim 30, further comprising:
a bunching radio frequency spaced away from the electron gun;
at least one condenser lens located between the bunching radio frequency and the electron gun; and
an adjustable objective lens located between the bunching radio frequency and the imager.

33. The electron microscope of claim 29, further comprising radio frequency waves of 400 MHz-3 GHz and 100 W-5 kW compress a longitudinal length of the at least $10^5$ electrons between the electron gun and the imager.

34. The electron microscope of claim 29, further comprising super-cooling an internal surface of a radio frequency cavity to 10 Kelvin or less, and the radio frequency cavity being a machinable and super-conducting material.

35. The electron microscope of claim 29, wherein the image is created by the imager using scanning electron microscopy.

36. The electron microscope of claim 29, wherein the image is created by the imager using transmission electron microscopy.

37. A method of using an electron microscope, the method comprising:
 (a) receiving a shaped laser beam in an upstream radio frequency cavity;
 (b) super-cooling the upstream cavity to a temperature less than or equal to 10 Kelvin;
 (c) generating an electron beam in the upstream cavity;
 (d) bunching the electron beam in a downstream radio frequency cavity; and
 (e) using the electron beam to create a specimen image.

38. The method of claim 37, further comprising using the downstream cavity to bunch a pulse of at least $10^5$ electrons of the electron beam with a time resolution of less than 1 picosecond.

39. The method of claim 37, further comprising using a radio frequency wave of 500 MHz-3 GHz and 100 W-5 kW inside the downstream cavity.

40. The method of claim 37, further comprising receiving the shaped femtosecond laser pulse in a specimen chamber downstream of the cavities.

41. The method of claim 37, further comprising varying the electron beam with at least one condenser lens between the cavities, and varying the electron beam with an objective lens after the downstream cavity.

42. The method of claim 37, further comprising creating the magnified image with scanning electron microscopy.

43. The method of claim 37, further comprising creating the magnified image with transmission electron microscopy.

44. The method of claim 37, further comprising shaping pulses of the laser beam with a computer-controlled pulse shaper.

45. The method of claim 37, further comprising retrofitting the cavities onto a previously assembled microscope.

* * * * *

UNITED STATES PATENT AND TRADEMARK OFFICE
CERTIFICATE OF CORRECTION

PATENT NO. : 9,024,256 B2  Page 1 of 1
APPLICATION NO. : 14/453235
DATED : May 5, 2015
INVENTOR(S) : Chong-Yu Ruan et al.

It is certified that error appears in the above-identified patent and that said Letters Patent is hereby corrected as shown below:

Title Page, (56) References Cited, OTHER PUBLICATIONS
Page 2, column 2, line 18 "Type ll" should be --Type II--

Column 3
Line 45          "amplifers" should be --amplifiers--

Column 4
Line 18          "emitance" should be --emittance--

Column 5
Line 15          "sub-pm" should be --sub-μm--

Signed and Sealed this
Twenty-second Day of December, 2015

Michelle K. Lee
*Director of the United States Patent and Trademark Office*